(12) United States Patent
Sundar

(10) Patent No.: US 7,527,694 B2
(45) Date of Patent: May 5, 2009

(54) SUBSTRATE GRIPPING APPARATUS

(75) Inventor: Satish Sundar, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 101 days.

(21) Appl. No.: 11/423,966

(22) Filed: Jun. 14, 2006

(65) Prior Publication Data

US 2006/0219179 A1    Oct. 5, 2006

Related U.S. Application Data

(62) Division of application No. 10/767,195, filed on Jan. 28, 2004, now abandoned.

(51) Int. Cl.
*C23C 16/00* (2006.01)
*B05C 13/00* (2006.01)
*B05C 13/02* (2006.01)
*B05C 21/00* (2006.01)
*C23F 1/00* (2006.01)
*H01L 21/306* (2006.01)

(52) U.S. Cl. ............. 118/729; 118/728; 118/730; 118/500; 118/503; 156/345.12; 156/345.14; 156/345.23; 156/345.51

(58) Field of Classification Search ........... 118/728, 118/729, 730, 500, 503; 156/345.12, 345.14, 156/345.23, 345.51; 279/1
See application file for complete search history.

(56) References Cited

U.S. PATENT DOCUMENTS

| 4,436,297 | A | * | 3/1984 | Chandhoke | 271/3.05 |
| 4,724,621 | A | * | 2/1988 | Hobson et al. | 34/218 |
| 5,040,484 | A | * | 8/1991 | Mears et al. | 118/503 |
| 6,104,002 | A | | 8/2000 | Hirose et al. | |
| 6,393,334 | B1 | * | 5/2002 | Lewis et al. | 700/117 |
| 2003/0075109 | A1 | | 4/2003 | Arai | |
| 2003/0118741 | A1 | | 6/2003 | Gibson et al. | |

* cited by examiner

*Primary Examiner*—Michael Cleveland
*Assistant Examiner*—Keath T Chen
(74) *Attorney, Agent, or Firm*—Patterson & Sheridan, LLP

(57) ABSTRACT

In one embodiment, a substrate centering apparatus for centering a substrate on a substrate support is provided. In one embodiment, the invention comprises an apparatus that is mounted to an underside of a substrate support and includes a lever that projects upward through a support surface of the substrate support. The lever may be biased toward a center of the substrate support to contact an edge of a substrate. A mechanism is coupled to the lever and moves the lever radially outward to release the substrate. In one embodiment, the mechanism is actuated as the substrate support moves downward to a position that facilitates substrate handoff.

9 Claims, 6 Drawing Sheets

SUBSTRATE GRIPPING APPARATUS

CROSS-REFERENCE TO RELATED APPLICATIONS

This application is a divisional application of U.S. patent application Ser. No. 10/767,195, filed Jan. 28, 2004, now abandoned which is incorporated by reference herein.

BACKGROUND OF THE DISCLOSURE

1. Field of Invention

The invention relates generally to the processing of semiconductor substrates, and relates more particularly to the centering of a substrate on a substrate support within a semiconductor substrate processing system.

2. Background of the Invention

Integrated circuits have evolved into complex devices that can include millions of transistors, capacitors and resistors on a single chip. The evolution of chip designs continually requires faster circuitry and greater circuit density that demand increasingly precise fabrication techniques and processes. One fabrication process frequently used is chemical vapor deposition (CVD). Chemical vapor deposition is generally employed to deposit a thin film on a substrate or a semiconductor substrate.

Chemical vapor deposition is generally accomplished by introducing a precursor gas into a vacuum chamber. The precursor gas is typically directed through a showerhead situated near the top of the chamber. The precursor gas reacts to form a layer of material on the surface of the substrate that is positioned on a heated substrate support (e.g., a heater) typically fabricated from aluminum. Purge gas is routed through holes in the support to the edge of the substrate to prevent deposition at the substrate's edge that may cause the substrate to adhere to the support. Deposition by-products produced during the reaction are pumped from the chamber through an exhaust system.

Consistency in the characteristics and quality of processed substrates is a key concern. During handoff of the substrate from a transfer mechanism (e.g., a robot) to the substrate support, or during processing, the position of the substrate may shift relative to the support, resulting in variations in the process results from substrate to substrate. Thus, substrate centering mechanisms are sometimes employed in an attempt to consistently maintain the position of each substrate relative to the support.

Incorporation of substrate centering mechanisms in the process chamber is difficult due to the sensitivity of the CVD process to mechanisms in the chamber (for example, magnetic and/or electric field characteristics) and to the hostile environment of the chamber itself. Conventional substrate centering techniques often focus on improving repeatable robot handling and have proven to be reasonably reliable and accurate; however, such techniques also tend to be costly and require complex software. Furthermore, such techniques generally address the centering of the substrate on the support during handoff from a transfer mechanism, but they typically do not account for movement of the substrate on the support, which may occur during and/or after handoff.

Therefore, there is a need for a substrate centering apparatus.

SUMMARY OF INVENTION

In one embodiment, a substrate centering apparatus for centering a substrate on a substrate support is provided. In one embodiment, the invention comprises an apparatus that is mounted to an underside of a substrate support and includes a lever that projects upward through a support surface of the substrate support. The lever may be biased toward a center of the substrate support to contact an edge of a substrate. A mechanism is coupled to the lever and moves the lever radially outward to release the substrate. In one embodiment, the mechanism is actuated as the substrate support moves downward to a position that facilitates substrate handoff.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

The invention generally provides a substrate centering apparatus that is advantageous in eliminating variations in process results due to movement and/or misalignment of the substrate on a substrate support. The invention is illustratively described below as a chemical vapor deposition system, such as a barrier chemical vapor deposition (BCVD) system, available from Applied Materials, Inc. of Santa Clara, Calif. However, it should be understood that the invention has utility in other system configurations such as physical vapor deposition systems, ion implant systems, etch systems, chemical vapor deposition systems and any other system in which centering of a semiconductor substrate on a substrate support is desirable.

Figure 1A:
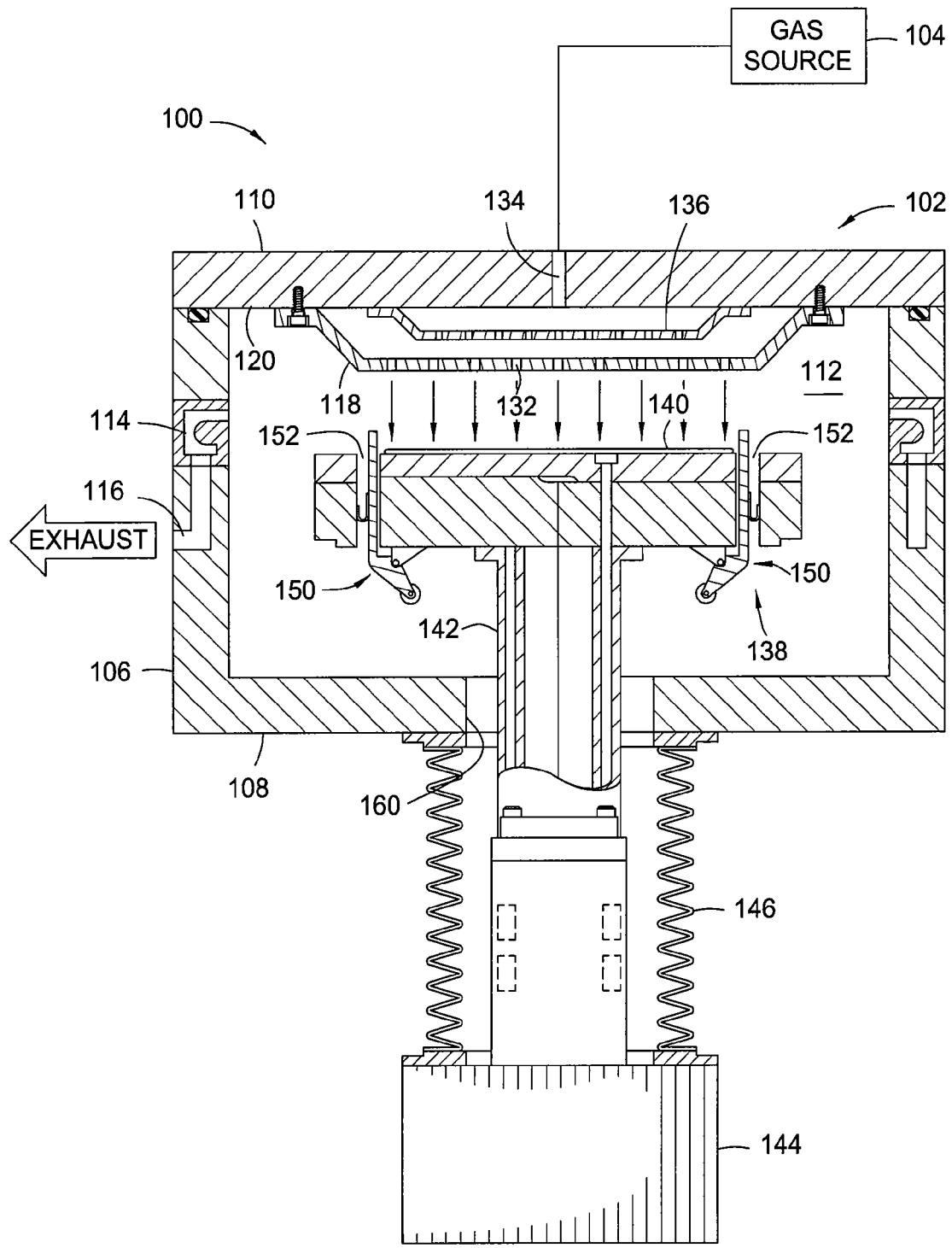
FIG. 1A depicts a schematic, sectional view of one embodiment of a processing chamber having a substrate centering apparatus disposed therein.

FIG. 1A is a cross-sectional view of one embodiment of a chemical vapor deposition system 100 that is advantageously adapted to benefit from the present invention. The system 100 generally includes a chamber 102 coupled to a gas source 104. The chamber 102 has walls 106, a bottom 108 and a lid 110 that define a process volume 112. The walls 106 and bottom 108 are typically fabricated from a unitary block of aluminum. The chamber 102 contains a pumping ring 114 that couples the process volume 112 to an exhaust port 116. The exhaust port 116 is coupled to various pumping components (not shown) that exhaust and control the pressure within the process volume 112.

The lid 110 is supported by the walls 106 and can be removed to service the chamber 102. The lid 110 is generally comprised of aluminum and may additionally contain heat transfer fluid channels for regulating the temperature of the lid 110 by flowing a heat transfer fluid therethrough.

A showerhead 118 is coupled to an interior side 120 of the lid 110. The showerhead 118 is typically fabricated from aluminum. The showerhead 118 generally includes a perforated area 132 that facilitates passage of gases therethrough.

A mixing block 134 is disposed in the lid 110. The mixing block 134 is coupled to the gas source 104, such that process and other gases may be introduced to the process volume 112 by passing through the mixing block 134 and showerhead 118. Typically, cleaning gases from a cleaning source (not shown) are also introduced through the mixing block 134 to the process volume 112. A perforated blocker plate 136 is disposed between the showerhead 118 and mixing block 134 to enhance the uniform distribution of gases passing through the showerhead 118 and into the chamber 102. The blocker plate 136 is typically fabricated from aluminum.

Figure 1B:
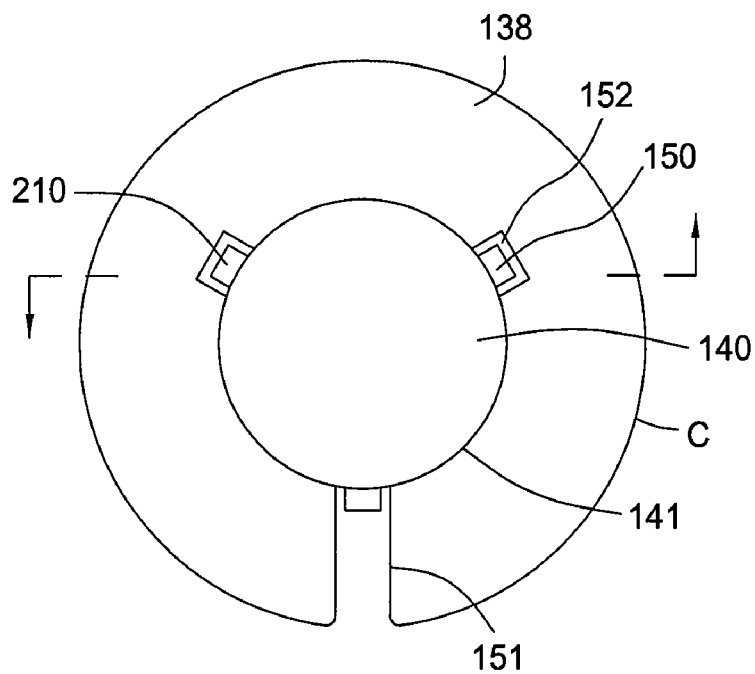
FIG. 1B depicts a top view of the support assembly and substrate centering apparatus illustrated in FIG. 1A.

A support assembly 138 is centrally disposed within the chamber 102 beneath the showerhead 118. The support assembly 138 supports a substrate 140 during processing and includes a moveable shaft 142 and at least three substrate centering apparatuses 150 coupled thereto. The support assembly 138 generally is fabricated from aluminum, ceramic or a combination of aluminum and ceramic and typically includes a vacuum port (not shown) and at least one embedded heating element (not shown). The vacuum port is used to apply a vacuum between the substrate 140 and support assembly 138, for securing the substrate 140 to the substrate support assembly 138 during processing. The heating element, such as an electrode or resistive element embedded in the support assembly 138, is coupled to a power source (not shown) for heating the support assembly 138 and substrate 140 positioned thereon to a predetermined temperature. In one embodiment, the heating element maintains the substrate 140 at a uniform temperature of about 150 to 400 degrees. Alternatively, heating lamps or other heat sources may be utilized to heat the substrate 140. As illustrated in FIG. 1B, which is a top view of the support assembly 138 illustrated in FIG. 1A, at least three apertures 152 are formed in the support assembly 138 to allow the substrate centering apparatuses 150 to pass therethrough. In one embodiment, at least one of the apertures 152 is a slot 151 that extends to the circumference C of the support assembly 138.

The shaft 142 is coupled between the support assembly 138 and an actuator 144. The actuator 144 moves the support assembly 138 between an elevated position as shown and a lowered position. The elevated position places the substrate 140 proximate to the showerhead 118 for processing. The lowered position spaces the substrate 140 from the showerhead 118 to allow access to the substrate 140 by a transfer robot (not shown). The actuator 144 may also be adapted for rotating the shaft 142. A bellows 146 disposed between the support assembly 138 or shaft 142 and the chamber bottom 108 provides a vacuum seal between the process volume 112 and the atmosphere outside the chamber 102 while facilitating movement of the support assembly 138. In one embodiment, the shaft 142 is disposed substantially centrally through an aperture 160 in the chamber bottom 108. The shaft 142 provides a conduit for electrical leads, vacuum and gas supply lines between the support assembly 138 and other components of the system 100.

The support assembly 138 generally is grounded such that RF power supplied by a power source (not shown) to the showerhead 118 (or other electrode positioned within or near the lid assembly of the chamber) may excite the gases disposed in the process volume 112 between the support assembly 138 and the showerhead 118. The RF power generally has a frequency of between a few Hz to 13 MHz or higher. In one embodiment, the power source comprises a dual frequency source that provides a low frequency power at less than about 2 MHz (preferably about 200 to 500 kHz) and a high frequency power at greater than 13 MHz (preferably about 13.56 kHz). The frequencies may be fixed or variable. Generally, the power requirements decrease or increase with a corresponding decrease or increase in substrate size.

In operation, the semiconductor substrate 140 may be secured to the support assembly 138 by providing a vacuum therebetween. In other embodiments, an electrostatic chuck or other form of substrate clamp may be used. The temperature of the substrate 140 is elevated to a pre-determined process temperature by regulating thermal transfer to the support assembly by the heating element. During the deposition process, the substrate is heated to a constant temperature, typically between 300° C. and 550° C.

Gaseous components, which in one embodiment may include silane and tungsten hexafluoride, are supplied from a gas panel to the process chamber through the mixing block 134 and showerhead 118 to form a gaseous mixture. The gaseous mixture reacts to form a layer of tungsten on the substrate 140. To prevent deposition at the substrate's edge and possible adherence of the substrate 140 to the support assembly 138, purge gases flow from the support assembly 138 around the perimeter of the substrate 140.

Figure 2A:
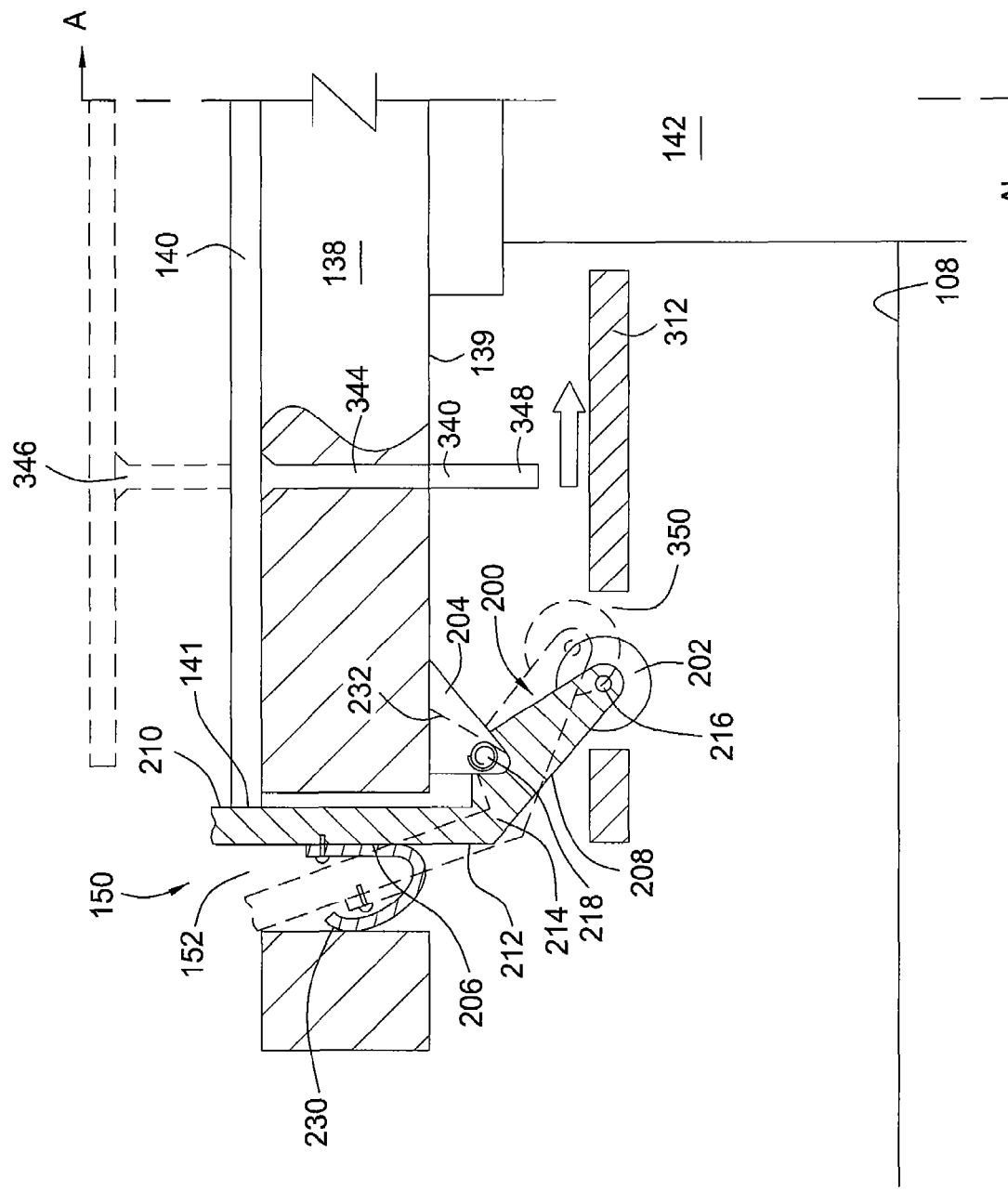
FIG. 2A is a sectional view of the substrate centering apparatus illustrated in FIGS. 1A and 1B, illustrated in an elevated position.

FIG. 2A is a sectional view of the substrate centering apparatus 150 illustrated in FIG. 1A. In one embodiment, the substrate centering apparatus 150 comprises a pivot 200, a roller 202, and a mounting flange 204. The pivot 200 comprises a lever 206 coupled to an arm 208. The lever 206 has a first end 210 and a second end 212, and is sized to extend through one of the apertures 152 in the substrate support assembly 138. The aperture 152 is large enough to allow a pre-defined radial displacement of the lever 206. The first end 210 of the lever 206 is adapted to protrude a distance above the surface of the substrate support assembly 138, i.e., to contact an edge 141 of the substrate 140.

In one embodiment, the arm 208 is angled relative to the lever 206. The arm 208 comprises a first end 214 that is coupled to the second end 212 of the lever 206 and a second end 216 that is coupled to the roller 202. The arm 208 includes a pivot hole (not shown) that accepts a pin 218. The pin 218 passes through the mounting flange 204, which is mounted to the underside 139 of the substrate support assembly 138, thereby allowing the pivot 200 to rotate relative to the mounting flange 204 and substrate support assembly 138 about the pin 218.

The substrate centering apparatus 150 additionally includes a biasing member 230. The biasing member 230 is generally adapted to bias the first end 210 of the arm 206 toward the center of the substrate support 138. In one embodiment, the biasing member 230 is a flat spring having a first end coupled to the arm 206 and a free end disposed against the substrate support 138. Alternatively, the biasing member 230 may be a compression spring, a solenoid, a motor or other device suitable for moving the first end 210 of the pivot 200 toward the center of the substrate support 138. In yet another embodiment, the biasing member 230 may be a torsion spring 232 (shown in phantom) disposed around the pin 218.

Figure 2B:
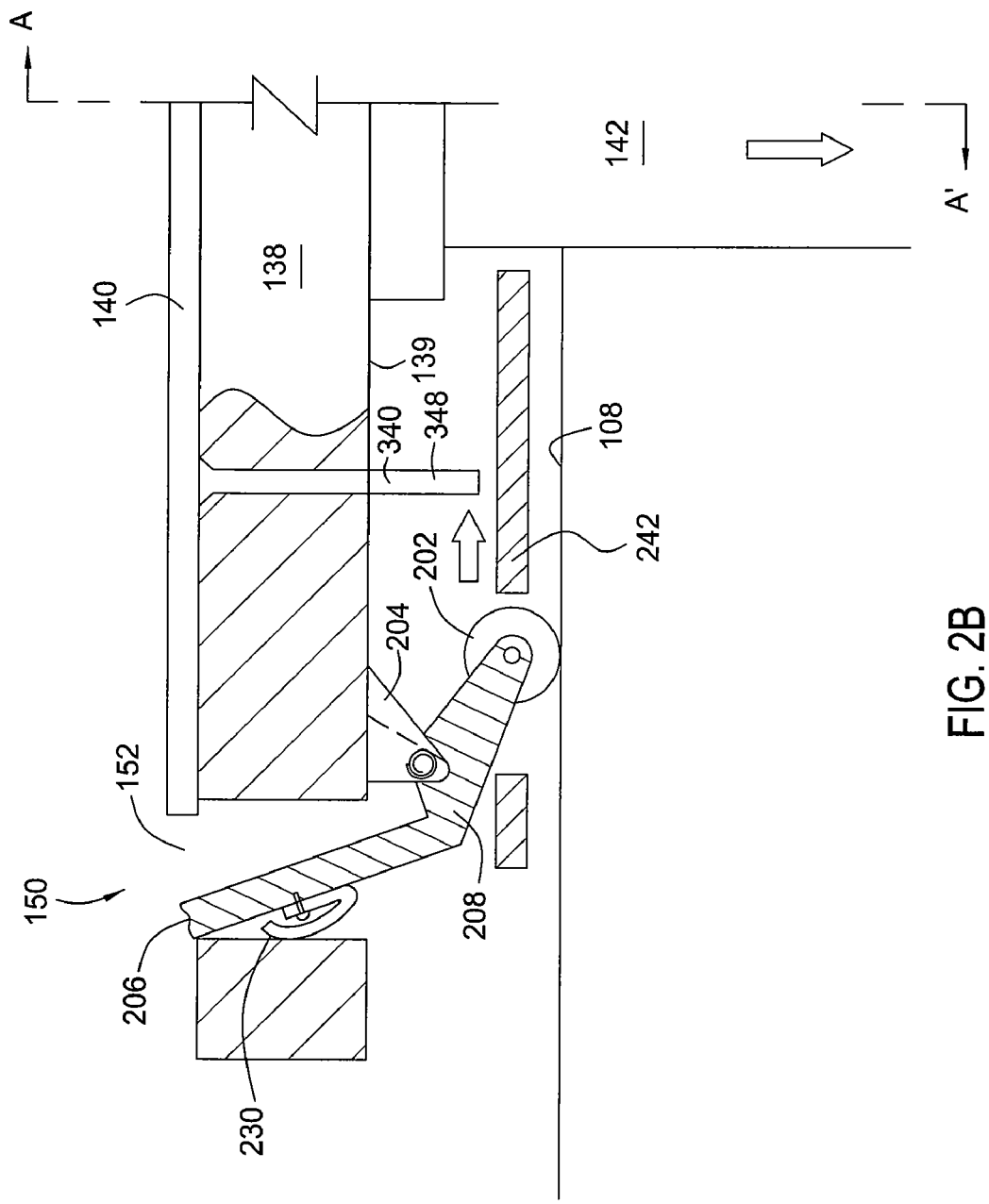
FIG. 2B is a sectional view of the substrate centering apparatus of FIG. 2A, illustrated in a lowered position.

When the substrate support assembly 138 is in a raised position (i.e., as illustrated in FIGS. 1A and 2A) to support a substrate 140 for processing, biasing member 230 biases the lever 206 portion of the pivot 200 radially inward, so that the first end 210 of the lever 206 contacts the edge 141 of the substrate 140 and moves the substrate 140 toward the center of the substrate support assembly 138. Once processing is completed, the substrate support assembly 138 moves downward, as illustrated in FIG. 2B. As the substrate support assembly 138 approaches the bottom 108 of the chamber 100, the roller 202 contacts the chamber bottom 108 and is forced to roll radially inward. The movement of the roller 202 rotates the lever 206 radially outward (e.g., about an axis substantially parallel to a plane of the substrate support assembly 138), as illustrated in phantom in FIG. 2A, so that the first end 210 of the lever 206 releases the edge 141 of the substrate 140, thereby creating a pocket or clearance for substrate handoff.

The operation of the substrate centering mechanism 150 illustrated in FIGS. 2A-B allows the substrate 140 to be supported in a centered orientation throughout processing, thereby substantially preventing displacement of the substrate 140 during processing. Furthermore, the substrate centering mechanism 150 does not adversely affect magnetic fields in the chamber 100, the disturbance of which might also alter process results.

Figure 3:
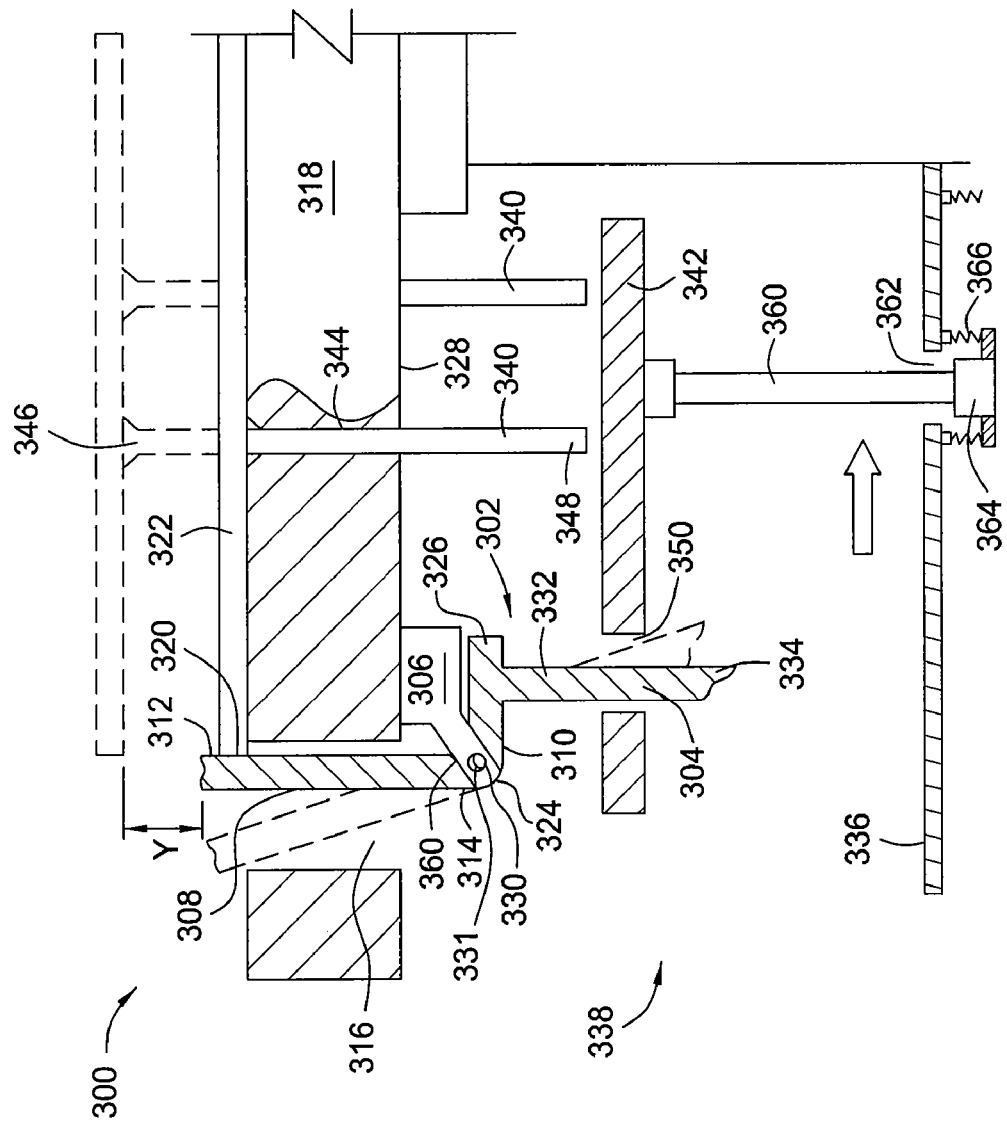
FIG. 3 is a partial sectional view of another embodiment of a substrate centering apparatus according to the present invention.

FIG. 3 is a partial sectional view of another embodiment of a substrate centering apparatus 300 according to the present invention. In FIG. 3, one of the at least three substrate centering apparatuses 300 is shown for brevity. The substrate centering apparatus 300 is substantially similar to the substrate centering apparatus 150 described with reference to FIGS. 2A-B and comprises a substantially L-shaped pivot 302, an actuating arm 304 and a mounting flange 306. The pivot 302 comprises a lever 308 coupled to a pivot arm 310. The lever 308 has a first end 312 and a second end 314, and is sized to extend through one of the apertures 316 in the substrate support assembly 318. The aperture 316 is large enough to allow a pre-defined radial displacement of the lever 308.

In one embodiment, the pivot arm 310 forms a substantially right angle with the lever 308. The pivot arm 310 comprises a first end 324 that is coupled to the second end 314 of lever 308 and a second end 326 that is coupled the actuating arm 304. The pivot arm 310 includes a pivot hole (not shown) that accepts a pin 330. The pin 330 passes through the mounting flange 306, which is mounted to the underside 328 of the substrate support assembly 318, thereby allowing the pivot 302 to rotate relative to the mounting flange 306 and the substrate support assembly 318 about the pin 330.

The actuating arm 304 comprises a first end 332 coupled to the pivot arm 310 and a second end 334 that extends toward the bottom 336 of the chamber 338. In one embodiment, the second end 334 of the actuating arm 304 includes a fillet or radius to facilitate rotation of the L-shaped pivot 302. In another embodiment, the second end 334 of the actuating arm 304 may include a roller.

In one embodiment, the chamber 338 additionally includes a plurality of lift pins 340 and a lift plate 342. The lift pins 340 are disposed through apertures 344 in the substrate support assembly 318 and have first flared ends 346 adapted for contacting the substrate 322 and second ends 348 that protrude from the underside 328 of the substrate support assembly 318 when the lift pins 340 are in an un-actuated position. The lift plate 342 is positioned beneath and substantially parallel to the substrate support assembly 318 and is supported upon a shaft 360. The shaft 360 extends downward through an aperture 362 in the chamber bottom 336, and the shaft 360 is coupled to an actuator 364 that drives the shaft 360 up and down to adjust the height of the lift plate 342. A bellows 366 disposed between the shaft 360 and the chamber bottom 336 provides a vacuum seal between the process volume and the atmosphere outside the chamber, while facilitating movement of the shaft 360 and lift plate 342. In one embodiment, the lift plate 342 comprises a substantially flat plate having at least two apertures 350 positioned substantially beneath the L-shaped pivots 302.

When the substrate support assembly 318 is in a raised position to support the substrate 322 for processing, the torsion spring 331 biases the lever 308 portion of the pivot 302 radially inward, so that the first end 312 of the lever 308 contacts the edge 320 of the substrate 322 and biases the substrate 322 toward the center of the substrate support assembly 318. During processing, the lift pins 340 remain in an un-actuated position, and the lift plate 342 does not contact the lift pins 340. Once processing is completed, the substrate support assembly 318 moves downward. As the substrate support assembly 318 approaches the bottom 336 of the chamber 338, the actuating arm 304 contacts the chamber bottom 336 and is forced to slide or rotate radially inward. The rotation of the actuating arm 304 rotates the lever 308 radially outward (e.g., about an axis substantially parallel to a plane of the substrate support assembly 318), so that the first end 312 of the lever 308 disengages from the edge 320 of the substrate 322, thereby creating a pocket or clearance for substrate handoff. The downward movement of the substrate support assembly 318 also brings the substrate support assembly 318 closer to the lift plate 342, which contacts the second ends 348 of the lift pins 340 as the lift plate 342 is driven upward by the actuator 364. The lift pins 340 are urged upward through the substrate support assembly 318 as the lift plate 342 moves upward, so that the first ends 346 of the lift pins 340 lift the substrate 322 off of the substrate support assembly 318 and maintain the substrate 322 in a spaced apart position relative to the substrate support assembly 318 (as shown in phantom).

The apertures 350 in the lift plate 342 allow the actuating arms 304 of the pivots 302 to pass through the lift plate 342 as the substrate support assembly 318 moves downward, so that the substrate centering apparatus 300 does not interfere with the operation of the lift plate 342 and lift pins 340. Alternatively, the apertures 350 formed in the lift plate 342 extend to the circumference of the lift plate 342 to allow for clearance of the substrate centering apparatus 300. Furthermore, the outward rotation of the lever 308 creates a clearance y between the first end 312 of the lever 308 and the first ends 346 of the lift pins 340 that is large enough to allow a robot blade to remove the substrate 322 from the lift pins 340.

It is understood that the chambers of the embodiments depicted in FIGS. 1, 2A-B and 4 may be configured with a plurality of lift pins 240 disposed through apertures 244 in the substrate support assembly 138, wherein the lift pins 240 are actuated by a lift plate 242 such as described with reference to FIG. 3.

Figure 4:
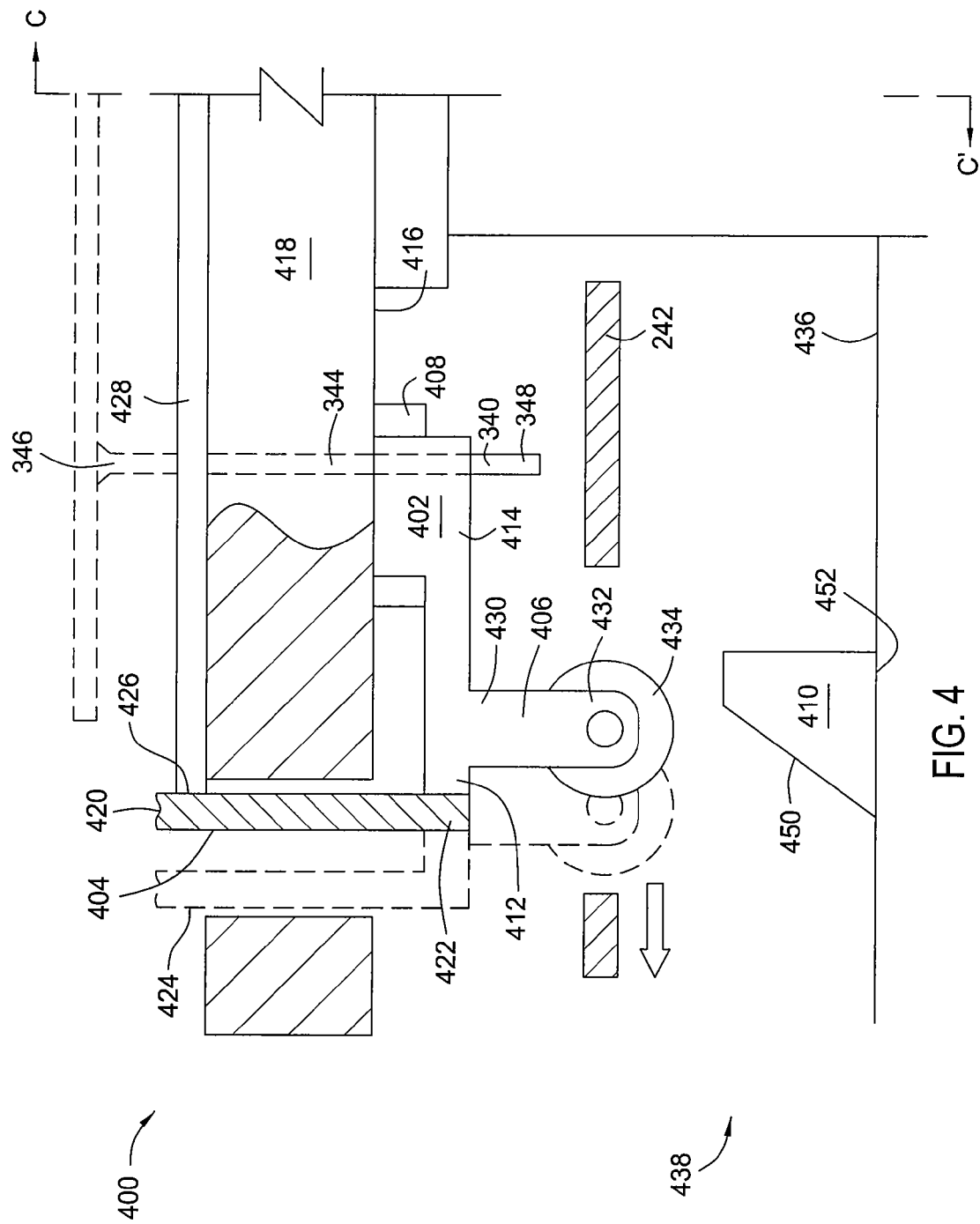
FIG. 4 is a partial sectional view of another embodiment of a substrate centering apparatus according to the present invention.

FIG. 4 is a partial sectional view of another embodiment of a substrate centering apparatus 400 according to the present invention. The substrate centering apparatus 400 comprises a base 402, a lever 404, a roller arm 406, a slide 408 and a ramp 410. The base 402 comprises a first end 412 and a second end 414. The first end 412 of the base 402 is coupled to the lever 404, which extends upward therefrom at a substantially right angle. The second end 414 of the base 402 is slidably coupled to the slide 408 mounted on the underside 416 of the substrate support assembly 418. The lever 404 has a first end 420 and a second end 422, and is sized to be disposed within the aperture 424 in the substrate support assembly 418, the aperture 424 being large enough to allow a pre-defined radial displacement of the lever 404. The first end 420 of the lever 404 is adapted to protrude a distance above the surface of the substrate support assembly 418, i.e., to contact an edge 426 of the substrate 428. The second end 422 of the lever 404 is coupled to the base 402.

The roller arm 406 is coupled below the base 402. The roller arm 406 comprises a first end 430 coupled to the base 402 and a second end 432 coupled to a roller 434. The ramp 410 comprises a sloped surface 450 and a substantially flat surface 452 for mounting. The ramp 410 is coupled to the bottom 436 of the chamber 438 and is positioned approximately beneath the base 402 of the substrate centering apparatus 400. The ramp 410 is positioned so that the sloped surface 450 faces radially outward relative to the substrate support assembly 418.

A spring (not shown) biases the base 402 radially inward. As the substrate support assembly 418 moves downward, the roller 434 contacts the ramp 410 on the bottom 436 of the chamber 438, and the downward motion of the substrate support assembly 418 urges the roller 434 to roll down the ramp 410. As the roller 434 rolls down and outward along the ramp 410, the base 402 of the substrate centering apparatus 400 moves radially outward along the linear slide, spacing the lever 404 from the edge 426 of the substrate 428 to facilitate substrate transfer.

Figure 5:
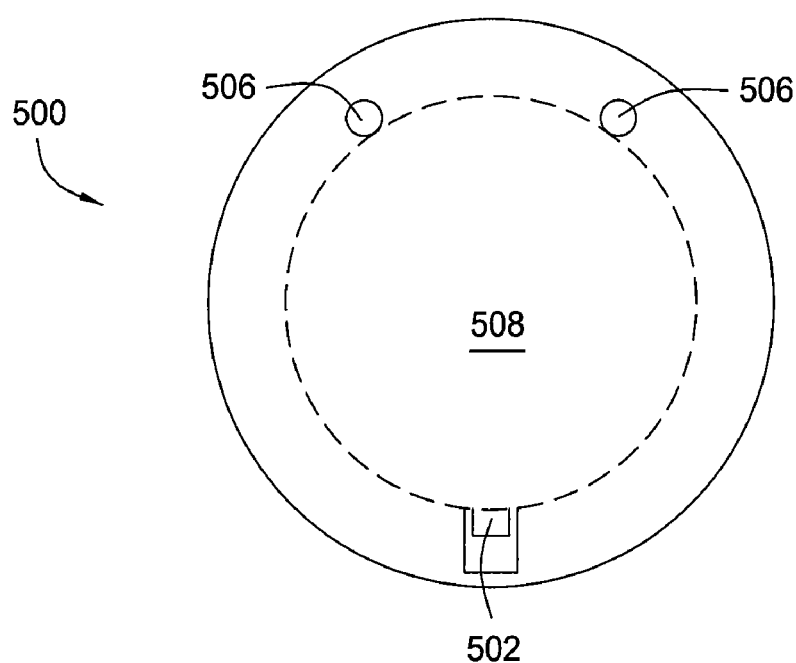
FIG. 5 is a top view of another embodiment of a support assembly having a substrate centering apparatus incorporated therein.

FIG. 5 is a top view of another embodiment of a support assembly 500 having a substrate centering apparatus 502 incorporated therein. In the embodiment illustrated, the support assembly 500 includes at least two fixed pins 506 and at least one substrate centering apparatus 502. The fixed pins 506 are fixed in place relative to the support assembly 500 and are adapted to project upward from the support surface 508 to contact edges of a substrate (shown in phantom). The substrate centering apparatus 502 may be configured in a manner similar to any of the substrate centering apparatuses (e.g., 150, 300, 400) illustrated in the preceding Figures. The substrate centering apparatus 502 is biased to urge the substrate toward a center of the support surface 508, so that edges of the substrate distal from the substrate centering apparatus 502 abut the fixed pins 506. The substrate is thereby maintained in a centered position on the support surface 508 until the substrate centering apparatus 502 releases the edge of the substrate, e.g., when a portion of the substrate centering apparatus 502 engages the bottom of the chamber.

Thus the present invention represents a significant advancement in the field of semiconductor substrate processing. An apparatus is provided that maintains the substrate in a centered orientation throughout processing, substantially preventing substrate damage due to displacement of the substrate. The apparatus may be adapted for use in processing chambers that include lift plate and lift pins, and is adapted to be disengaged in a manner than allows sufficient clearance for substrate handoff.

Although the teachings of the present invention that have been shown and described in detail in a chemical vapor deposition chamber, those skilled in the art can readily devise other varied embodiments in other processing chambers, including chambers that incorporate the use of lift pins to separate a substrate from a support surface, that still incorporate the teachings and do not depart from the scope and spirit of the invention.

What is claimed:

1. A processing chamber having substrate centering apparatus, the processing chamber comprising:
   a chamber body having a bottom;
   a vertically moveable substrate support disposed in the chamber body and having a first side adapted to support a substrate during processing;
   at least three levers movably coupled to the substrate support in a spaced-apart relation proximate a perimeter of the substrate support;
   a first end of each lever extending beyond the first side of the substrate support, the first end adapted to engage an edge of the substrate and adapted to be displaced radially relative to a center of the substrate support when the substrate support moves between a raised position and a lowered position;
   a second end of each lever positioned below a second side of the substrate support and adapted to engage the bottom of the chamber body when the substrate support is in a lowered position, the second end comprising a radius or fillet;
   a plurality of lift pin holes disposed through the substrate support, said lift pins holes being positioned radially inward of the at least three levers;
   a plurality of lift pins disposed through the plurality of lift pin holes, each lift pin comprising a first end adapted for supporting a substrate thereon and a second end extending below the second side of the substrate support; and
   a lift plate positioned beneath and substantially parallel to the substrate support, adapted for contacting the second ends of the plurality of lift pins and urging the plurality of lift pins upward through the plurality of lift pin holes in the substrate support, wherein the lift plate comprises at least three apertures, each aperture positioned substantially beneath one of the at least three levers, to allow the second ends of the at least three levers to pass therethrough, such that actuation of the levers is decoupled from actuation of the lift pins.

2. The processing chamber of claim 1, wherein the substrate support further comprises at least three apertures adapted to receive the at least three levers therethrough.

3. The processing chamber of claim 2, wherein the at least three apertures disposed through the substrate support are sized to accommodate a pre-defined radial displacement of the at least three levers.

4. The processing chamber of claim 1, wherein each of the at least three levers is adapted to slide linearly along an axis substantially parallel to a plane of the substrate support.

5. The processing chamber of claim 4, further comprising:
   at least three bases disposed on the second side of the substrate support, said bases extending along at least a portion of a radius of the substrate support; and
   at least three linear slides adapted to slidably engage the at least three rails, each of the at least three linear slides being coupled to one of the at least three levers.

6. The processing chamber of claim 1, wherein the second ends of each of the at least three levers further comprises a roller.

7. The processing chamber of claim 1, further comprising at least three biasing members adapted for biasing the at least three levers radially inward relative to the substrate support.

8. The processing chamber of claim 7, wherein the at least three biasing members are torsion springs disposed around pins coupling the at least three levers to the substrate support.

9. The processing chamber of claim 7, wherein the at least three biasing members comprise at least one of a compression spring or solenoid.

* * * * *